United States Patent
Zota et al.

(10) Patent No.: US 10,892,299 B2
(45) Date of Patent: Jan. 12, 2021

(54) MAGNETIC FIELD CONTROLLED TRANSISTOR

(71) Applicant: International Business Machines Corporation, Armonk, NY (US)

(72) Inventors: Cezar Bogdan Zota, Ruschlikon (CH); Bernd W. Gotsmann, Horgen (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/051,457

(22) Filed: Jul. 31, 2018

(65) Prior Publication Data
US 2020/0043978 A1 Feb. 6, 2020

(51) Int. Cl.
| | |
|---|---|
| H01L 27/22 | (2006.01) |
| H01L 43/02 | (2006.01) |
| H03K 19/18 | (2006.01) |
| H01L 43/10 | (2006.01) |
| H03F 15/00 | (2006.01) |
| H01L 43/08 | (2006.01) |

(52) U.S. Cl.
CPC .......... *H01L 27/22* (2013.01); *H01L 43/02* (2013.01); *H01L 43/08* (2013.01); *H01L 43/10* (2013.01); *H03F 15/00* (2013.01); *H03K 19/18* (2013.01)

(58) Field of Classification Search
CPC ....................................................... H01L 27/22
See application file for complete search history.

(56) References Cited

U.S. PATENT DOCUMENTS

| | | | |
|---|---|---|---|
| 6,178,112 B1 * | 1/2001 | Bessho | G11C 11/22 257/E43.004 |
| 6,201,259 B1 | 3/2001 | Sato et al. | |

(Continued)

FOREIGN PATENT DOCUMENTS

| | | |
|---|---|---|
| WO | 2014/199144 A1 | 12/2014 |
| WO | 2017/136564 A1 | 8/2017 |

OTHER PUBLICATIONS

R. Tauk et al., Low Electron Mobility of Field-Effect Transistor Determined by Modulated Magnetoresistance, Nov. 2007, Journal of Applied Physics, vol. 102, Issue 10, 7 pages.

(Continued)

*Primary Examiner* — Lincoln D Donovan
*Assistant Examiner* — Colleen J O Toole
(74) *Attorney, Agent, or Firm* — Daniel Morris; Otterstedt, Wallace & Kammer, LLP

(57) ABSTRACT

A magnetic field controlled transistor circuit includes a first electrode, a second electrode, and a channel including a magneto-resistive material. The channel is arranged between the first and second electrodes and electrically coupled to the first and second electrodes. The transistor circuit further includes a third electrode, a fourth electrode, and a control layer including an electrically conductive material. The control layer is arranged between the third and fourth electrodes and electrically coupled to the third and fourth electrodes. In addition, an insulating layer including an insulating material is provided. The insulating layer is arranged between the channel and the control layer and configured to electrically insulate the channel from the control layer. A related method for operating a transistor circuit and a corresponding design structure are also provided.

15 Claims, 4 Drawing Sheets

(56) References Cited

U.S. PATENT DOCUMENTS

| | | |
|---|---|---|
| 7,298,594 B2 | 11/2007 | Onogi et al. |
| 7,531,883 B2 | 5/2009 | Huang et al. |
| 9,257,540 B2 | 2/2016 | Rhie et al. |
| 10,210,970 B2 * | 2/2019 | Ma .................. H01L 43/08 |
| 2014/0339617 A1 | 11/2014 | Rhie et al. |

OTHER PUBLICATIONS

C. Ciccarelli, et al., Gate Controlled Magnetoresistance in a Silicon Metal-Oxide-Semiconductor Field-Effect-Transistor, Aug. 25, 2010, Applied Physics Letters 97, Feb. 21, 2006, 3 pages.

Ryosho Nakane, et al., Magnetoresistance of a Spin Metal-Oxide-Semiconductor Field-Effect Transistor With Ferromagnetic MNAS Source and Drain Contacts, Nov. 22, 2010, downloaded from IOPScience, published in Japanese Journal of Applied Physics, vol. 49, No. 11R, 2 pages.

Shuang Jia et al., "Weyl semimetals, Fermi arcs and chiral anomalies", 1140 Nature Materials, vol. 15, Nov. 2016. pp. 1-15.

\* cited by examiner

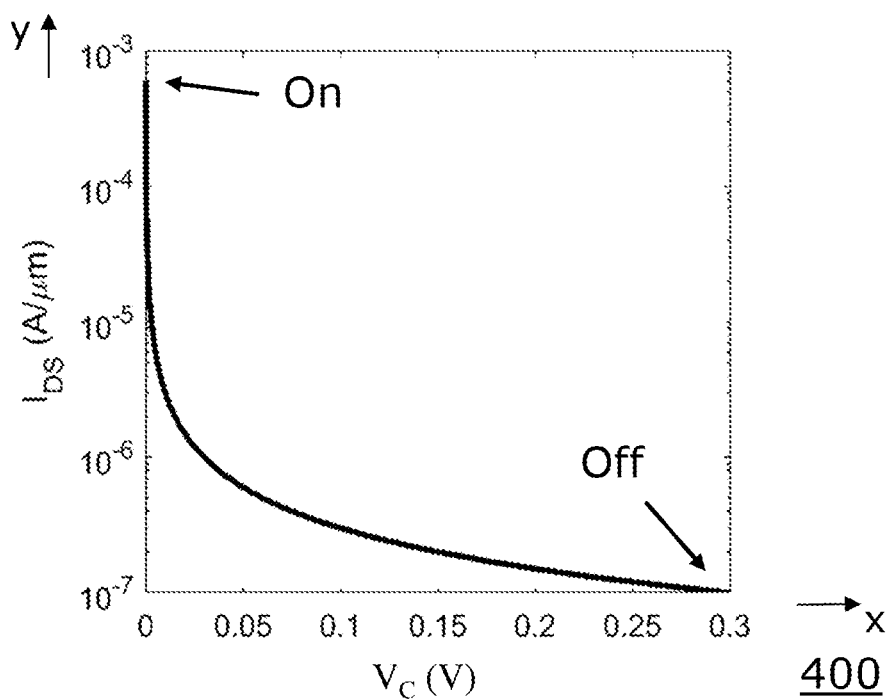
FIG. 4
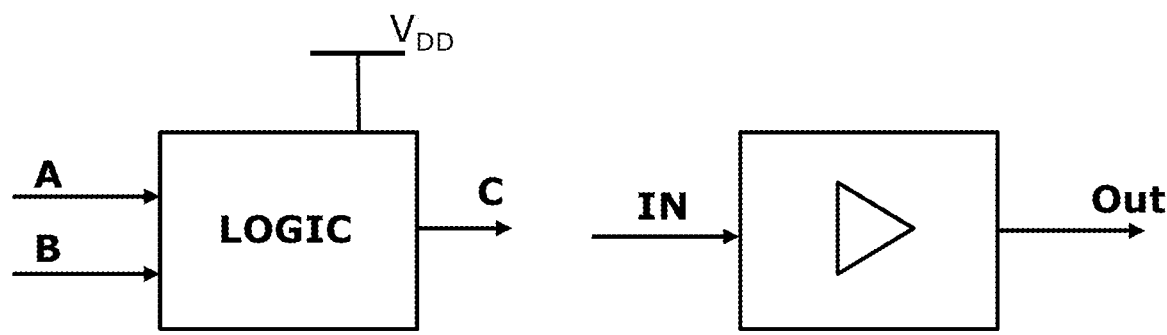
FIG. 5
FIG. 6

MAGNETIC FIELD CONTROLLED TRANSISTOR

BACKGROUND

Electronic transistors, in particular Field Effect Transistors (FET) are a fundamental building block of integrated circuits. However, the supply voltage cannot be scaled much below 0.5 V due to the limit of 60 mV/decade for the change of the drain current with respect to the gate bias. This means that power consumption and power density cannot be much further reduced, which limits the scaling of CMOS technology as well as the possibility for extremely low-power CMOS circuits. Furthermore, the performance of high-frequency amplifiers has reached the transconductance limit of III-V HEMTs, around 3 mS/μm.

Accordingly, there is a need for alternative transistor circuits.

SUMMARY

According to a first aspect, the invention is embodied as a magnetic field controlled transistor circuit. The transistor circuit comprises a first electrode, a second electrode and a channel comprising a magneto-resistive material. The channel is arranged between the first and the second electrode and electrically coupled to the first and the second electrode. The transistor circuit further comprises a third electrode, a fourth electrode and a control layer comprising an electrically conductive material. The control layer is arranged between the third and the fourth electrode and electrically coupled to the third and the fourth electrode. In addition, an insulating layer comprising an insulating material is provided. The insulating layer is arranged between the channel and the control layer and configured to electrically insulate the channel from the control layer.

According to another aspect of the invention, a method for operating a transistor device according to the first aspect is provided. The method comprises steps of driving a control current between the third and the fourth electrode through the control layer, thereby applying a magnetic field on the channel and controlling the resistivity of the channel by the magnetic field being induced by the control current.

According to another aspect, a design structure is provided. The design structure is tangibly embodied in a machine readable medium for designing, manufacturing, or testing an integrated circuit. The design structure comprises a magnetic field controlled transistor circuit according to the first aspect.

Embodiments of the invention will be described in more detail below, by way of illustrative and non-limiting examples, with reference to the accompanying drawings.

BRIEF DESCRIPTION OF THE DRAWINGS

FIG. 4 shows a simulation of the drain source current in dependence on the control voltage of a magnetic field controlled transistor circuit according to an embodiment of the invention;

FIG. 5 is a simplified schematic block diagram of a logic circuit comprising a plurality magnetic field controlled transistor circuit according to an embodiment of the invention;

FIG. 6 shows a simplified diagram of a high frequency amplifier comprising a magnetic field controlled transistor circuit according to an embodiment of the invention.

DETAILED DESCRIPTION

According to embodiments of the invention, a transistor may be defined as a device which can amplify electrical signals as they are transferred through it from an input terminal to an output terminal.

Figure 1:
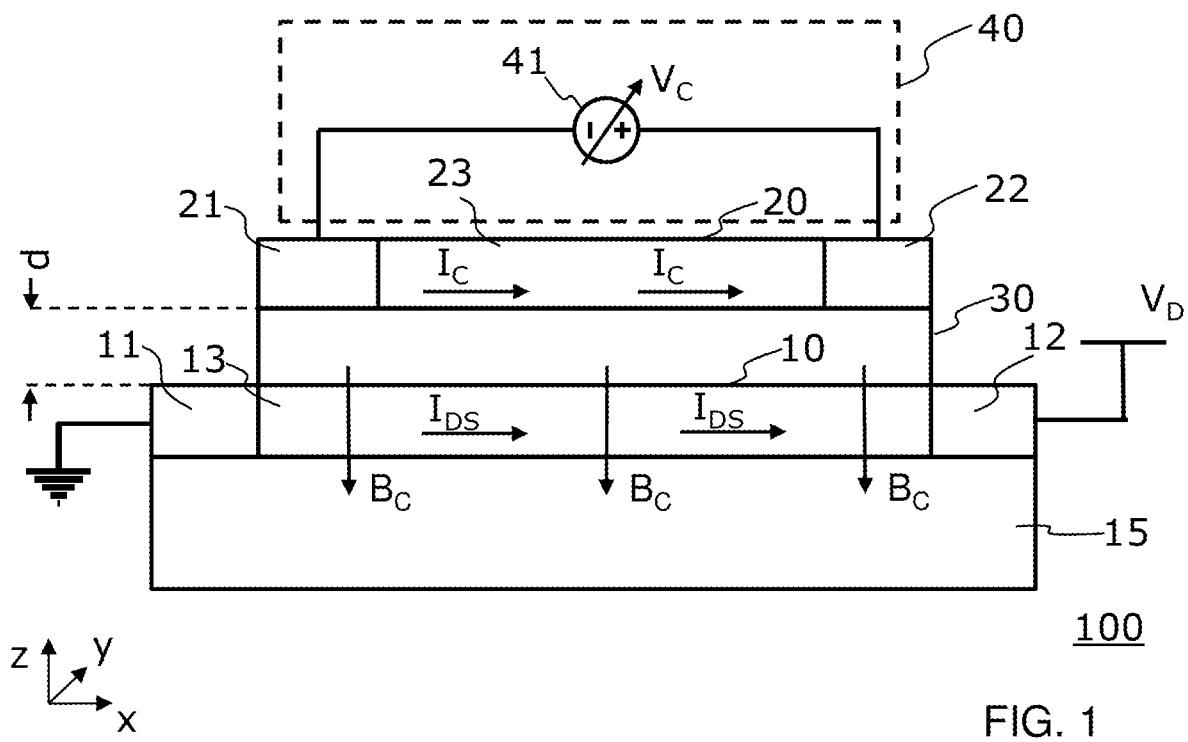
FIG. 1 is a simplified schematic block diagram of a magnetic field controlled transistor circuit according to an embodiment of the invention.

FIG. 1 is a simplified schematic block diagram of a magnetic field controlled transistor circuit 100 according to an embodiment of the invention. The transistor circuit 100 comprises a channel 10 which is arranged between a first electrode 11 and a second electrode 12. The channel 10 is embodied as magneto-resistive channel and comprises a magneto-resistive material 13. The first electrode 11 and the second electrode 12 are electrically connected to the channel 10. The first electrode 11 may also be denoted as source electrode and the second electrode 12 as drain electrode. Accordingly, a channel current $I_{DS}$ may flow between the first electrode 11 and the second electrode 12 if a drain-source voltage $V_{DS}$ is applied between the first electrode 11 and the second electrode 12. The channel 10, the first electrode 11 and the second electrode 12 are arranged on a substrate 15, e.g. a Si-substrate.

The magnetic field controlled transistor circuit 100 further comprises a control layer 20 which may also be denoted as control channel 20. The control layer 20 comprises an electrically conductive material. The electrically conductive material may be in particular a metal. The control layer 20 is arranged between a third electrode 21 and a fourth electrode 22. The third electrode 21 and the fourth electrode 22 are electrically connected to the control layer 20. Accordingly, a control current $I_C$ may flow between the third electrode 21 and the fourth electrode 22 if a control voltage $V_C$ is applied between the third electrode 21 and the fourth electrode 22.

The magnetic field controlled transistor circuit 100 further comprises an insulating layer 30 comprising an electrically insulating material 31. The insulating layer 30 is arranged between the channel 10 and the control layer 20. The insulating layer 30 electrically insulates the channel 10, the corresponding first electrode 11 and the corresponding second electrode 12 from the control layer 20, the corresponding third electrode 21 and the corresponding fourth electrode 22. The insulating material 31 may be in particular an oxide or nitride, e.g. $SiO_2$ or $Si_3N_4$.

The magnetic field controlled transistor circuit 100 further comprises a control circuit 40 for controlling the resistivity of the channel 20. The control circuit 40 encompasses a controllable voltage source 41 for providing a controllable control voltage $V_C$ to the third electrode 21 and the fourth electrode 22. Accordingly, the control circuit 40 drives the control current $I_C$ between the third electrode 21 and the fourth electrode 22 through the control layer 20. The control current $I_C$ induces a controllable magnetic field $B_C$, which may also be denoted as magnetic control field, in the channel 10. According to other embodiments, the control circuit 40 may comprise a controllable current source instead of the controllable voltage source 42 for driving the control current $I_C$ through the control layer 20. The magnetic control field $B_C$ is an Oersted field, i.e. a magnetic field that is induced from a current flowing though the conducting control layer 20. As the channel 10 comprises a magneto-resistive material, it changes its electrical resistance in dependence on the magnetic control field $B_C$ applied to it. More particularly, the higher the magnetic control field $B_C$, the higher the magnetoresistance of the magneto-resistive material of the channel 10.

The channel 10 and the control layer 20 are arranged in parallel to each other. More particularly, they extend in an x-direction and a y-direction in parallel to each other. In other words, they extend in an x-y plane in parallel to each other. In another embodiment, the channel 10 and the control layer 20 are have a right angle between them. The channel 10 and the control layer 20 are arranged with a distance d in a z-direction to each other. The distance d corresponds to a thickness t of the insulating layer 30. The distance d is chosen such that it is on the one hand large enough to provide a sufficient electrical insulation and on the other hand small enough to provide a magnetic control field of sufficient strength.

The magneto-resistive material 13 may be embodied as a Weyl semimetal.

An overview of the current research on Weyl semimetals is provided by Shuang Jia, Su-Yang Xu and M. Zahid Hasan Weyl in the document "Weyl semimetals, Fermi arcs and chiral anomalies", 1140 NATURE MATERIALS, VOL 15, NOVEMBER 2016. According to this document "Weyl semimetals are semimetals or metals whose quasiparticle excitation is the Weyl fermion, a particle that played a crucial role in quantum field theory, but has not been observed as a fundamental particle in vacuum. Weyl fermions have definite chiralities, either left-handed or right-handed. In a Weyl semimetal, the chirality can be understood as a topologically protected chiral charge. Weyl nodes of opposite chirality are separated in momentum space and are connected only through the crystal boundary by an exotic non-closed surface state, the Fermi arcs. Weyl fermions are robust while carrying currents, giving rise to exceptionally high mobilities. Their spins are locked to their momentum directions, owing to their character of momentum-space magnetic monopole configuration. Because of the chiral anomaly, the presence of parallel electric and magnetic fields can break the apparent conservation of the chiral charge, making a Weyl metal, unlike ordinary nonmagnetic metals, more conductive with an increasing magnetic field."

According to preferred embodiments, the Weyl-semimetal may be $WP_2$, $MoP_2$ or $WTe_2$. These materials show a strong dependence of their magneto-resistance on the applied magnetic field.

According to other embodiments, the magneto-resistive material 13 may be a colossal magneto-resistive material. More particularly, the colossal magneto-resistive material may be a colossal manganite of the chemical formula $RE_{1-x}AE_xMnO_3$, wherein RE is selected from the group consisting of La, Pr and Sm and AE is selected from the group consisting of Ca, Sr, Ba and Pb.

Figure 2:
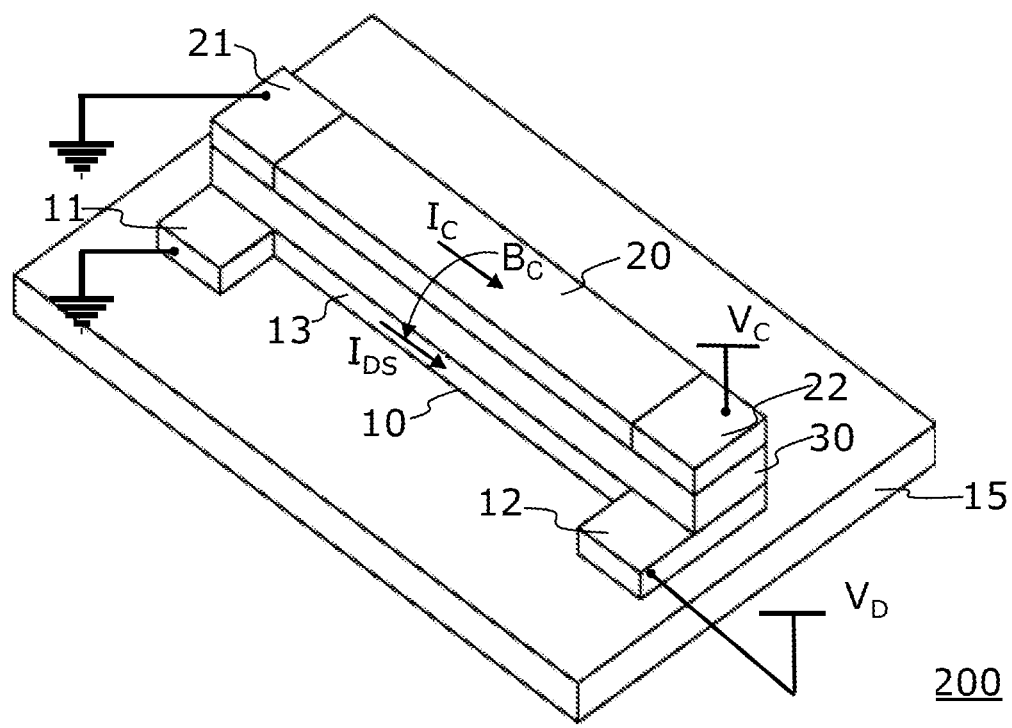
FIG. 2 shows a simplified 3-dimensional view of a magnetic field controlled transistor circuit according to an embodiment of the invention.

FIG. 2 shows a simplified 3-dimensional view of a magnetic field controlled transistor circuit 200 according to an embodiment of the invention. The transistor circuit 200 may correspond to the transistor circuit 100 shown in FIG. 1.

The transistor circuit 200 comprises a channel 10 which is arranged between a first electrode 11 and a second electrode 12. The channel 10 is embodied as magneto-resistive channel and comprises a magneto-resistive material 13. The first electrode 11 and the second electrode 12 are electrically connected to the channel 10.

Accordingly, a channel current $I_{DS}$ may flow between the first electrode 11 and the second electrode 12 if a drain-source voltage $V_D$ is applied between the first electrode 11 and the second electrode 12.

The magnetic field controlled transistor circuit 100 further comprises a control layer 20 which may also be denoted as control channel 20. The control layer 20 comprises an electrically conductive material. The electrically conductive material may be in particular a metal. The control layer 20 is arranged between a third electrode 21 and a fourth electrode 22. The third electrode 21 and the fourth electrode 22 are electrically connected to the control layer 20. Accordingly, a control current $I_C$ may flow between the third electrode 21 and the fourth electrode 22 if a control voltage $V_C$ is applied between the third electrode 21 and the fourth electrode 22.

The magnetic field controlled transistor circuit 100 further comprises an insulating layer 30 comprising an electrically insulating material. The insulating layer 30 is arranged between the channel 10 and the control layer 20.

The magnetic field controlled transistor circuit 200 further comprises a controllable voltage source for providing the controllable control voltage $V_C$ to the third electrode 21 and the fourth electrode 22. The control voltage $V_C$ drives the control current $I_C$ between the third electrode 21 and the fourth electrode 22 through the control layer 20. The control current $I_C$ induces a controllable magnetic field $B_C$ in the channel 10.

Figure 3:
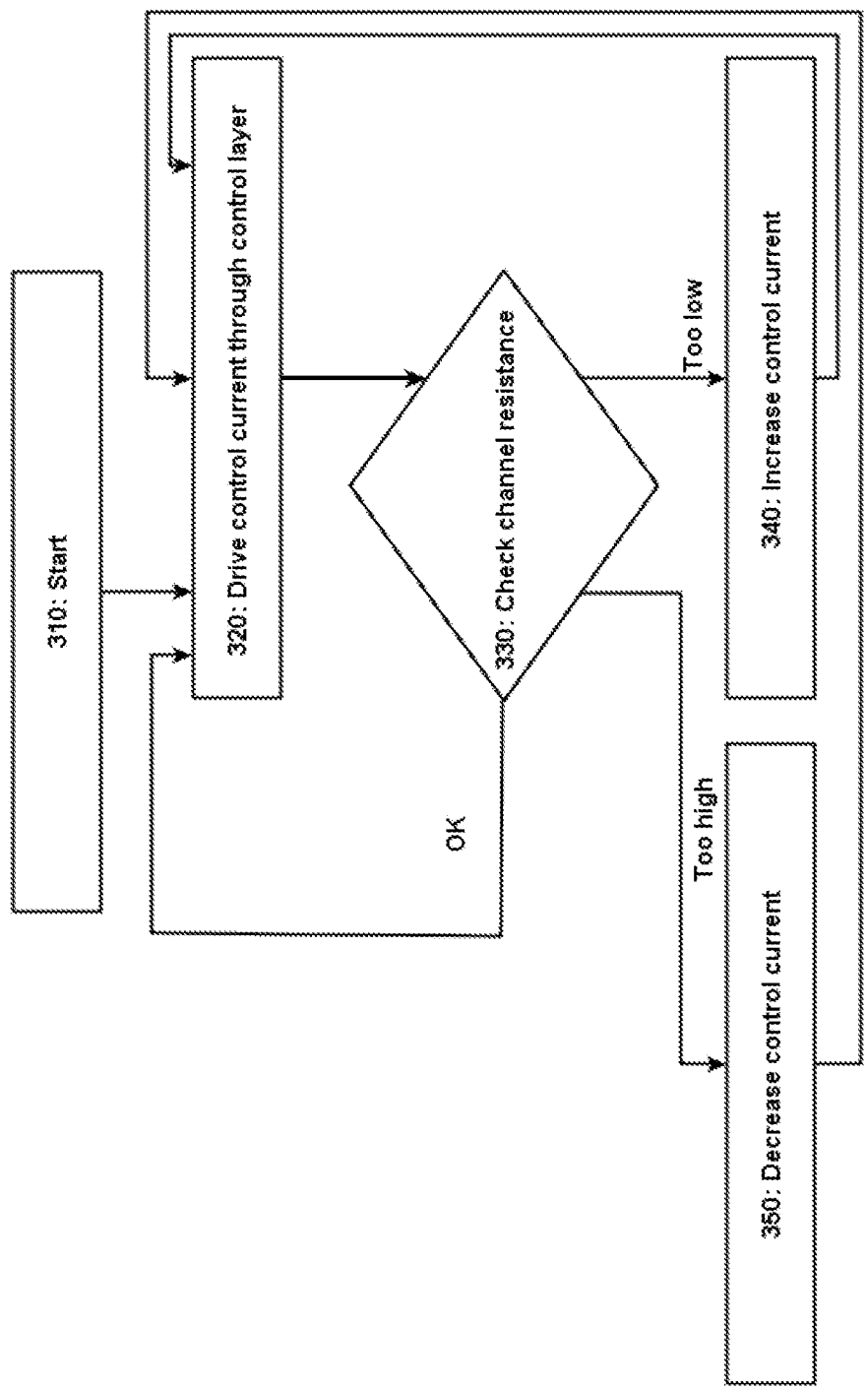
FIG. 3 shows a flow chart of methods steps of a method for operating a magnetic field controlled transistor according to an embodiment of the invention.

FIG. 3 shows a flow chart of methods steps of a method for operating a magnetic field controlled transistor according to an embodiment of the invention, e.g. of the magnetic field controlled transistors 100 or 200 as described above.

At a step 310, the method is started.

At a step 320, a control current is driven between the third electrode 21 and the fourth electrode 22 through the control layer 20. Thereby a magnetic field is induced and applied on the channel 10. The step 320 may encompass e.g. applying a control voltage to the third and the fourth electrode to drive the control current.

At a step 330, the control circuit 40 checks whether the resistance of the channel 10 corresponds with a target resistance. If the resistance is OK for the respective application, the control circuit 40 continues with monitoring the channel resistance.

If the channel resistance is too low, the control circuit 40 increases at a step 340 the control current, e.g. by increasing the control voltage.

If the channel resistance is too high, the control circuit 40 decreases at a step 350 the control current, e.g. by decreasing the control voltage.

FIG. 4 illustrates the functioning of a magnetic field controlled transistor according to an embodiment of the invention. More particularly, FIG. 4 shows a simulation of the drain source current $I_{DS}$ in dependence on the control voltage $V_C$. The y-axis denotes the drain source current $I_{DS}$ in A/μm and the x-axis the control voltage $V_C$ in V.

The simulation is based on an analytical model embodied as follows:

The magnetoresistance ρ of the channel is approximated according to the embodied model versus the magnetic control field $B_C$ as $$\rho(B_C) = \rho_0(1 + \beta B_C^\alpha);$$

wherein β and α are experimentally determined material parameters describing the change of magnetoresistance with respect to applied magnetic control field, and $\rho_0$ is the magnetoresistivity with no applied magnetic control field.

The magnetic control field $B_C$ is represented by $$B_C = \frac{\mu_0 V_C}{2\pi r R_C};$$

wherein $V_C$ is the control voltage, r is the thickness of the insulating layer 30, and $R_C$ is the resistance of the fourth electrode 22 and $\mu_0$ is the permeability of free space.

Then the drain source current $I_{DS}$ at a distance z into the magnetoresistive layer 13 may be simulated as follows:

$$I_D = \frac{V_{DS}}{R_0 h} \int_0^h \left(1 + \beta\left(\frac{\mu_0 V_C}{\pi R_C(r+z)}\right)^{1+\alpha}\right)^{-1} dz$$

wherein $R_0$ is the resistance of the magnetoresistive layer 13 with no applied magnetic control field and h is the height of the magnetoresistive layer 13.

The simulation shown in FIG. 4 uses values as follows:

| Parameter | Value |
|---|---|
| $\rho_0$ | 10 µΩcm |
| B | 5000 $T^\alpha$ |
| A | 1.8 |
| $R_C$ | 10 Ω |
| R | 3 nm |
| H | 5 nm |

As can be seen in FIG. 4, without a control voltage $V_C$ and hence no magnetic control field $B_C$, there is the highest drain source current corresponding to an On-state of the magnetic field controlled transistor.

On the other end, with a control voltage $V_C$ of app. 0.3 V, the drain source current reaches $10^{-6}$ A/µm corresponding to an off-state of the magnetic field controlled transistor.

Hence the off-state needs a bias voltage of app. 0.3 V.

Accordingly, a magnetic field controlled transistor according to embodiments of the invention utilizes in the on-state as well as on the off-state an electrical current. More particularly, in the On-state a drain-source current is flowing in the channel, while in the off-state a control current is flowing in the control layer.

The simulation shows that a magnetic field controlled transistor according to embodiments of the invention works similar to a PFET or a PNP bipolar transistor.

FIG. 5 shows a schematic circuit diagram of a logic circuit 500. The logic circuit 500 receives for example two input signals A and B, performs a logic operation on the two input signals A and B and outputs an output signal C of the logic operation. The logic operation may be e.g. an AND operation, an OR operation, a NAND operation etc. The respective logic operation may be implemented by magnetic field controlled transistor circuits according to embodiments of the invention, e.g. by a plurality of transistor circuits 100 as illustrated with reference to FIG. 1. Due to the use of magnetic field controlled transistors as described above, the logic circuit 500 may be configured to operate with a supply voltage $V_{DD}$ of less than 0.4 V.

FIG. 6 shows a schematic circuit diagram of a high frequency amplifier 600 comprising one or more magnetic field controlled transistor circuits, e.g. one or more transistor circuits 100 as illustrated with reference to FIG. 1. The high frequency amplifier 600 receives an input signal IN and provides an amplified output signal OUT. Due to the use of magnetic field controlled transistors as described above, which are able to achieve very high current gain together with low capacitance, the high frequency amplifier 600 may operate at a frequency of more than 1 THz.

Figure 7:
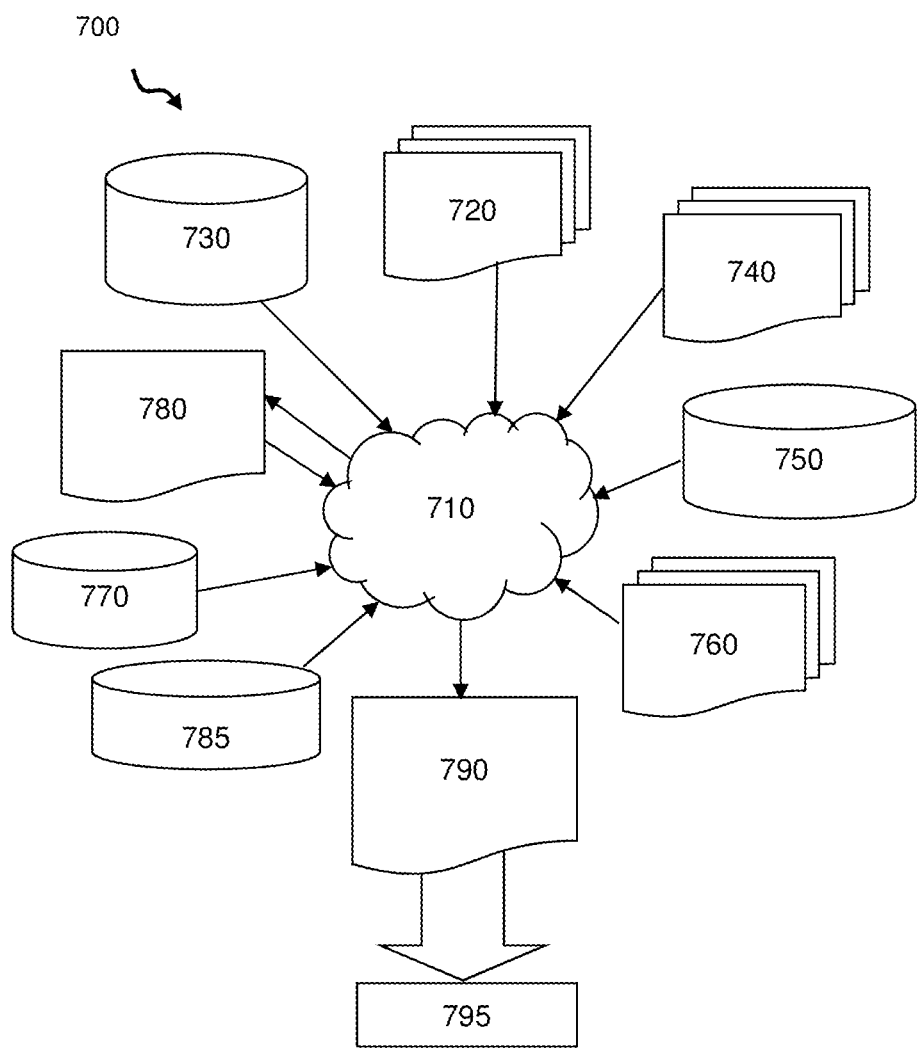
FIG. 7 shows a block diagram of an exemplary design flow.

FIG. 7 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of the design structures and/or devices described above and shown e.g. in FIGS. 1 and 2. The design structures processed and/or generated by design flow 700 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a machine-readable data transmission, gate array, or storage medium, design structure 720 may be accessed and processed by one or more hardware and/or software modules within design process 710 to simulate or otherwise functionally represent an electronic component, circuit, electronic or logic module, apparatus, device, or system such as those shown in FIGS. 1 and 2. As such, design structure 720 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of the components, circuits, devices, or logic structures shown in FIGS. 1 and 2 to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 2. In one embodiment, design structure 790 may comprise a compiled, executable HDL simulation model that functionally simulates the devices shown in figures and 2.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-17. Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, modifications described for one embodiment may be applied to another embodiment as appropriate.

What is claimed is:

1. A magnetic field controlled transistor circuit, comprising:
    a first electrode;
    a second electrode;
    a channel comprising a magneto-resistive material, the channel being arranged between the first and the second electrode and electrically coupled to the first and the second electrode;
    a third electrode;
    a fourth electrode;
    a control layer comprising an electrically conductive material, the control layer being arranged between the third and the fourth electrode and electrically coupled to the third and the fourth electrode; and
    an insulating layer comprising an insulating material, the insulating layer being arranged between the channel and the control layer and being configured to electrically insulate the channel from the control layer;
    wherein the magneto-resistive material is a colossal magneto-resistive material.

2. The transistor circuit according to claim 1, wherein the colossal magneto-resistive material is a colossal manganite of the chemical formula:

$$RE_{1-X}AE_XMnO_3,$$

wherein RE is selected from the group consisting of La, Pr and Sm and AE is selected from the group consisting of Ca, Sr, Ba and Pb.

3. The transistor circuit according to claim 1, further comprising:
a control circuit configured to control the resistivity of the channel by driving a control current between the third and fourth electrode through the control layer, wherein the control current induces a controllable magnetic field in the channel.

4. The transistor circuit according to claim 3, wherein the control circuit comprises a controllable current source or a controllable voltage source configured to drive the control current through the control layer.

5. The transistor circuit according to claim 1, wherein the channel and the control layer are arranged in parallel to each other.

6. A logic circuit comprising:
a plurality of magnetic field controlled transistor circuits, each of the transistor circuits in turn comprising:
a first electrode;
a second electrode;
a channel comprising a magneto-resistive material, the channel being arranged between the first and the second electrode and electrically coupled to the first and the second electrode;
a third electrode;
a fourth electrode;
a control layer comprising an electrically conductive material, the control layer being arranged between the third and the fourth electrode and electrically coupled to the third and the fourth electrode; and
an insulating layer comprising an insulating material, the insulating layer being arranged between the channel and the control layer and being configured to electrically insulate the channel from the control layer;
wherein the magneto-resistive material is a colossal magneto-resistive material.

7. The logic circuit according to claim 6, wherein the logic circuit is configured to operate with a supply voltage of less than 0.4 V.

8. A high frequency amplifier comprising one or more magnetic field controlled transistor circuits, each of said one or more transistor circuits in turn comprising:
a first electrode;
a second electrode;
a channel comprising a magneto-resistive material, the channel being arranged between the first and the second electrode and electrically coupled to the first and the second electrode;
a third electrode;
a fourth electrode;
a control layer comprising an electrically conductive material, the control layer being arranged between the third and the fourth electrode and electrically coupled to the third and the fourth electrode; and
an insulating layer comprising an insulating material, the insulating layer being arranged between the channel and the control layer and being configured to electrically insulate the channel from the control layer;
wherein the magneto-resistive material is a colossal magneto-resistive material.

9. The high frequency amplifier according to claim 8, wherein the one or more transistor circuits are configured to operate at a frequency of more than 1 THz.

10. A method for operating a magneto-resistive material, the channel being arranged between the first and the second electrode;
a third electrode;
a fourth electrode;
a control layer comprising an electrically conductive material, the control layer being arranged between the third and the fourth electrode; and
an insulating layer comprising an insulating material, the insulating layer being arranged between the channel comprising the magneto-resistive material and the control layer;
wherein the magneto-resistive material is a colossal magneto-resistive material;
the method comprising:
driving a control current between the third and the fourth electrode through the control layer, thereby applying a magnetic field on the channel and controlling the resistivity of the channel by the magnetic field being induced by the control current.

11. The method according to claim 10, further comprising:
applying a control voltage to the third and the fourth electrode to drive the control current.

12. The method according to claim 11, further comprising:
increasing the control voltage in order to increase the resistance of the channel; and
decreasing the control voltage in order to decrease the resistance of the channel.

13. A design structure tangibly embodied in a machine readable medium for designing, manufacturing, or testing an integrated circuit, the design structure comprising:
a magnetic field controlled transistor circuit, comprising:
a first electrode;
a second electrode;
a channel comprising a magneto-resistive material, the channel being arranged between the first and the second electrode and electrically coupled to the first and the second electrode;
a third electrode;
a fourth electrode;
a control layer comprising an electrically conductive material, the control layer being arranged between the third and the fourth electrode and electrically coupled to the third and the fourth electrode; and
an insulating layer comprising an insulating material, the insulating layer being arranged between the channel and the control layer and being configured to electrically insulate the channel from the control layer;
wherein the magneto-resistive material is a colossal magneto-resistive material.

14. The design structure according to claim 13, further comprising:
a control circuit configured to control the resistivity of the channel by driving a control current between the third first and fourth electrode through the control layer, wherein the control current induces a controllable magnetic field in the channel.

15. The design structure according to claim 13, wherein the control circuit comprises a controllable current source or controllable voltage source configured to drive the control current through the control layer.

* * * * *